(12) United States Patent
Benedict et al.

(10) Patent No.: US 10,777,294 B2
(45) Date of Patent: Sep. 15, 2020

(54) DRAM-LEVEL ERROR INJECTION AND TRACKING

(71) Applicant: Hewlett Packard Enterprise Development LP, Houston, TX (US)

(72) Inventors: Melvin K. Benedict, Magnolia, TX (US); Reza M. Bacchus, Spring, TX (US); Chi-li-ma Harnold, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 153 days.

(21) Appl. No.: 16/066,110

(22) PCT Filed: Jan. 26, 2016

(86) PCT No.: PCT/US2016/014931
§ 371 (c)(1),
(2) Date: Jun. 26, 2018

(87) PCT Pub. No.: WO2017/131639
PCT Pub. Date: Aug. 3, 2017

(65) Prior Publication Data
US 2019/0013085 A1    Jan. 10, 2019

(51) Int. Cl.
*G11C 29/00* (2006.01)
*G11C 29/42* (2006.01)
*G11C 29/02* (2006.01)
*G06F 11/22* (2006.01)
(Continued)

(52) U.S. Cl.
CPC .......... *G11C 29/42* (2013.01); *G06F 11/1068* (2013.01); *G06F 11/2215* (2013.01); *G11C 29/02* (2013.01); *G11C 29/52* (2013.01)

(58) Field of Classification Search
CPC ......... G11C 29/42; G11C 29/02; G11C 29/52; G06F 11/1068; G06F 11/2215
USPC ....... 714/718, 703, 708, 720, 746, 752, 758, 714/799, 800
See application file for complete search history.

(56) References Cited

U.S. PATENT DOCUMENTS 5,875,195 A    2/1999   Dixon
6,539,503 B1 * 3/2003   Walker ............... G01R 31/3183
                                                  714/32
7,818,626 B1   10/2010  Tsien
(Continued)

OTHER PUBLICATIONS

PCT International Search Report and Written Opinion, dated Sep. 12, 2016, PCT/US2016/014931, 12 pages.
(Continued)

*Primary Examiner* — Christine T. Tu
(74) *Attorney, Agent, or Firm* — Hewlett Packard Enterprise Patent Department

(57) ABSTRACT

One example includes a system. The system includes an error injection system. The error injection system includes an error injector to store a programmable control structure to define a memory error. The error injector being further used to inject the memory error into a respective one of a plurality of memory storage elements associated with a memory system at a predetermined address via an address controller and to determine if the memory error at the predetermined address associated with the respective one of the plurality of memory storage elements is corrected via error-correcting code (ECC) memory associated with the memory system.

16 Claims, 4 Drawing Sheets

(51) Int. Cl.
   *G06F 11/10*   (2006.01)
   *G11C 29/52*   (2006.01)

(56) References Cited

U.S. PATENT DOCUMENTS

| | | |
|---|---|---|
| 8,181,100 B1 | 5/2012 | Purdham |
| 8,627,163 B2 | 1/2014 | Ito |
| 8,707,104 B1 | 4/2014 | Jean |
| 9,275,757 B2 * | 3/2016 | Thomas ................. G11C 29/44 |
| 2004/0225943 A1 | 11/2004 | Brueggen |
| 2009/0249148 A1 * | 10/2009 | Ito ....................... G06F 11/1008 |
| | | 714/746 |
| 2013/0139008 A1 | 5/2013 | Kalyanasundharam |
| 2013/0275810 A1 | 10/2013 | Yigzaw |
| 2013/0326302 A1 * | 12/2013 | Han ................... H03M 13/1142 |
| | | 714/752 |

OTHER PUBLICATIONS

Xin Li, "A Realistic Evaluation of Memory Hardware Errors and Software System Susceptibility," 2009, 14 pages, <https://www.usenix.org/legacy/event/atc10/tech/full_papers/Li.pdf>.

* cited by examiner

DRAM-LEVEL ERROR INJECTION AND TRACKING

BACKGROUND

Computer systems implement memory structures to manipulate data for processing. As fabrication technology for memory continues to result in memory structures with decreasing size and increasing memory storage capacity, the probability for cell level error due to leakage can increase. Therefore, a memory system can often implement error-correcting code (ECC) memory to implement error correction, such as at manufacture. Thus, memory can be tested to determine if the error correction capability functions as designed. As a result, memory systems can be tested during manufacture or during the memory system design process to ensure reliable operation of the memory system.

DETAILED DESCRIPTION

A memory system implements an error injection system to inject errors at the dynamic random access memory (DRAM) level of a dual-inline memory storage module (DIMM) system and determining if the known injected errors are corrected at the DIMM level. The error injection system includes an error injector that is configured to store a control structure (e.g., programmable error control table) that stores predetermined parameters associated with error correction, such as predetermined errors, addresses associated with specific DRAMs of the DIMM system, and parameters for propagating the errors through a given DRAM in a controllable and predictable manner. The error injector is thus configured to inject the errors into a given DRAM via an address controller of the DIMM system. The error injection system can subsequently read-out the addresses of the DIMM system to determine if the errors have been corrected in the associated memory addresses of the specific DRAM.

Figure 1:
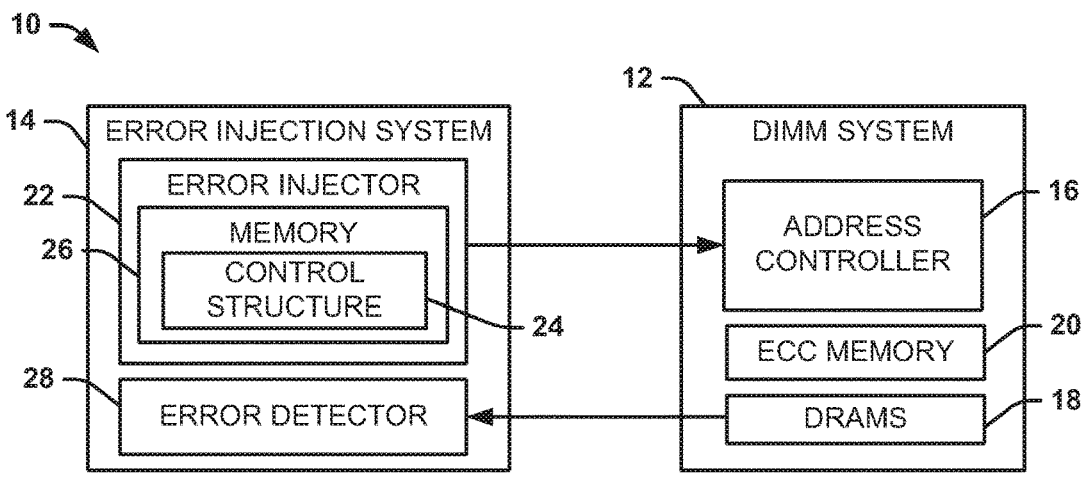
FIG. 1 illustrates an example of a memory testing system.

FIG. 1 illustrates an example of a memory testing system 10. As an example, the memory testing system 10 can correspond to a test fixture during manufacture (e.g., fabrication) of memory systems. In the example of FIG. 1, the memory testing system 10 includes a memory system 12, demonstrated as a DIMM system, that can be implemented in any of a variety of computer systems (e.g., a personal computer, laptop computer, tablet computer, enterprise server, smartphone, etc.). The memory testing system 10 also includes an error injection system 14 that is configured to test the error-correction capability of the DIMM system 12 to determine if errors can result while storing data in a quiescent state of the DIMM system 12.

The DIMM system 12 includes an address controller 16 that can correspond to peripheral circuitry associated with memory arrays associated with each of a plurality of memory storage elements 18 associated with the DIMM system 12. In the example of FIG. 1, the memory storage elements 18 are demonstrated as DRAMs, but could instead refer to any of a variety of other modular memory storage elements associated with one or more memory arrays. As an example, the DIMM system 12 can include a variety of different quantities of DRAMs 18 (e.g., between approximately four and approximately seventy-two). Therefore, the address controller 16 can control access to memory addresses of each of the DRAMs 18 in the DIMM system 12. Accordingly, during normal operation of the DIMM system 12, a processor can access the memory addresses of the DRAMs 18 via the address controller 16 to store data to and retrieve data from the memory arrays of the respective DRAMs 18. In addition, the DIMM system 12 includes an error-correcting code (ECC) memory 20 that is configured to implement error correction in the DRAMs 18.

The error injection system 14 is configured to inject memory errors into the DRAMs 18, such as during manufacture of the DIMM system 12. Thus, the error injection system 14 can test the efficacy of the ECC memory 20 to determine proper operation of the ECC memory 20, and thus the DIMM system 12. In the example of FIG. 1, the error injection system 14 includes an error injector 22 that is configured to inject the memory errors into the DRAMs 18 via the address controller 16 of the DIMM system 12. The memory errors can be generated via a control structure 24 that is stored in a memory 26 associated with the error injector 22. The control structure 24 can correspond to a programmable data structure that defines error injection parameters associated with injecting the memory errors into the DRAMs 18.

As an example, the control structure 24 can define a specific memory address in one or more of the DRAMs 18 in which the error injector 22 is to inject a memory error. The control structure 24 can also define the memory error or more than one memory error, such as in a predetermined or in a random manner. The control structure 24 can also define an error pattern in which the memory error or multiple memory errors can be distributed in the memory addresses of the DRAMs 18. Therefore, the control structure 24 can define multiple different ways of injecting the memory errors in the DRAMs 18 of the DIMM system 12.

Upon injecting the memory errors in the DRAMs 18 of the DIMM system 12, the error injection system 14 can be configured to read out the data from the DRAMs 18 of the DIMM system 12 to determine if the memory errors that were injected into the DRAMs 18 have been corrected by the ECC memory 20. In the example of FIG. 1, the error injection system 14 includes an error detector 28 that is configured to evaluate the data stored in the DRAMs 18, such as via the address controller 16, to determine whether the memory errors were corrected by the ECC memory 20. As an example, the memory errors can correspond to one or more error bits distributed in predetermined bit locations in respective error words, such as defined by the control structure 24. Therefore, the error detector 28 can be configured to evaluate the data stored in the DRAMs 18 to compare the predetermined memory addresses associated with the DRAMs 18 in which the memory errors were injected with the respective error words. Upon determining that the predetermined memory addresses associated with the DRAMs 18 in which the memory errors were injected does not include the respective error bit(s) corresponding to the error word(s), the error detector 28 can determine that the ECC memory 20 properly implemented error correction of the respective DRAMs.

The memory testing system 10 thus corresponds to a manner in which error injection, correction, and validation occurs at a finer level than an entire memory system-wide approach. In other words, the error injection system 14 can implement a lower-level approach to error injection and validation via the address controller 16, as opposed to at a memory platform-level or at a whole DIMM-level associated with the DIMM system 12. Based on the definitions of the memory errors via the control structure 24, the memory errors can be single-bit or small multi-bit errors to enable such DRAM-level error injection, correction, and validation. Accordingly, the error injection system 14 of the memory testing system 10 provides a means for implementing testing and validation of the ECC memory 20 of the DIMM system 12, such as at design or manufacturing of the DIMM system 12, based on predictably injecting memory errors into the DRAMs 18 of the DIMM system 12.

Figure 2:
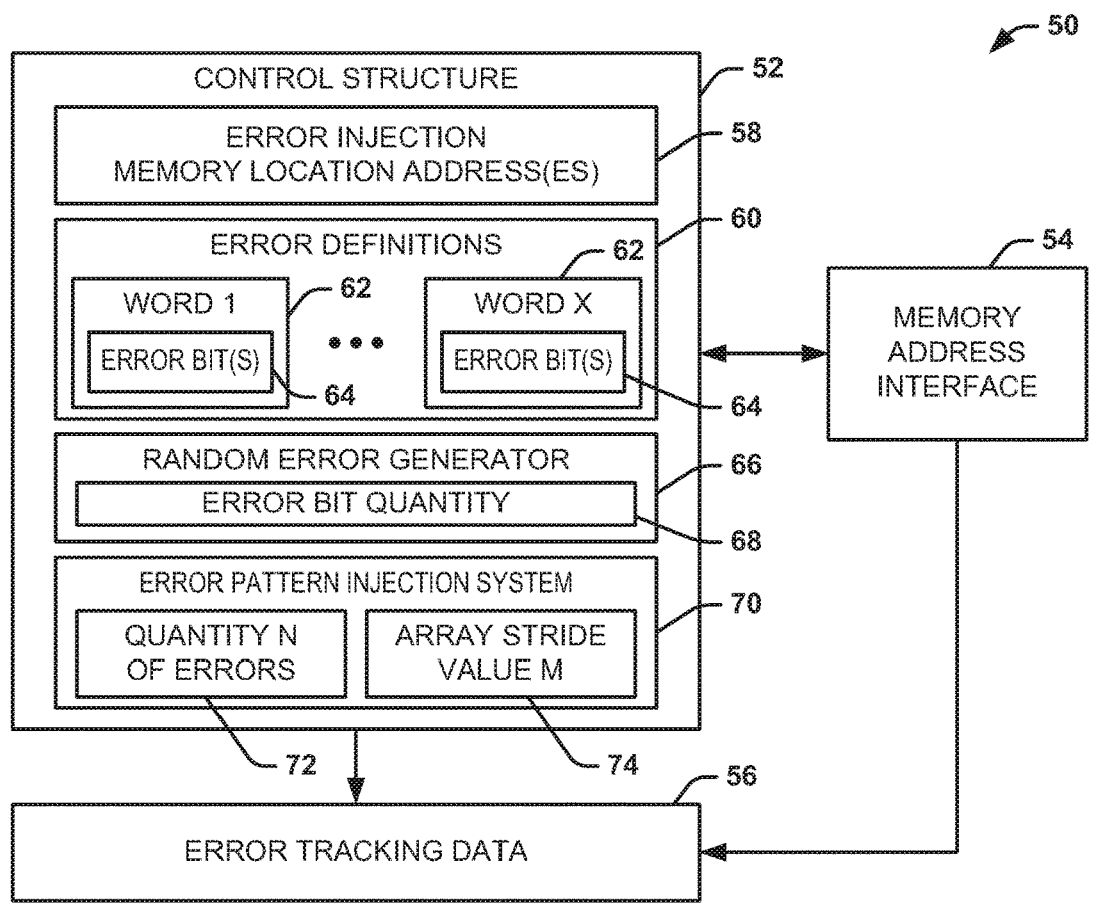
FIG. 2 illustrates an example of an error injector.

FIG. 2 illustrates an example of an error injector 50. The error injector 50 can correspond to the error injector 22 in the example of FIG. 1. Therefore, reference is to be made to the example of FIG. 1 in the following description of the example of FIG. 2.

The error injector 50 includes a control structure 52, which can correspond to the control structure 24 in the example of FIG. 1, and can thus be configured as a programmable data structure that defines error injection parameters associated with injecting memory errors. As an example, the control structure 52 can be stored in a memory (e.g., the memory 26). The error injector 50 also includes a memory address interface 54 that is configured to send commands to an address controller associated with a memory system (e.g., the DIMM system 12) to access the memory system to write the memory errors into associated memory storage elements (e.g., the DRAMs 18). The memory address interface 54 can thus implement error injection of the memory errors that are defined by the control structure 52, such as by accessing the control structure 52 from the associated memory. In addition, the memory address interface 54 can store the memory errors and the associated predetermined memory addresses of the memory storage elements to which the memory errors were written as error tracking data 56, such as likewise stored in the memory in which the control structure 52 is stored. Thus, the error tracking data 56 can be accessed by an error detector (e.g., the error detector 28) to compare the data stored in the predetermined memory addresses of the memory storage elements to which the memory errors were written with the memory errors to determined if the associated ECC memory (e.g. the ECC memory 20) corrected the respective memory errors.

The control structure 52 includes one or more error injection memory location addresses 58. The error injection memory location address(es) 58 can each correspond to a single programmable memory address to which a memory error is to be injected. As another example, the error injection memory location address(es) 58 can correspond to a first memory address in a pattern of memory addresses into which one or more memory errors are to be injected, as described in greater detail herein. The control structure 52 also includes a set of error definitions 60 that includes information regarding the specific memory errors to be injected into the DRAMs 18.

In the example of FIG. 2, the error definitions 60 define a plurality X of error words 62, where X is a positive integer, with each of the error words 62 having one or more defined error bits 64. Thus, as an example, the error bits 64 can overwrite data bits in a given memory address of a DRAM 18 to correspond to injection of a memory error into the given memory address of the DRAM 18. As an example, the quantity X can be approximately equal to a number of correction words in the ECC memory 20. Each of the error words 62 can have a different set of error bit(s) 64 to provide selective injection of memory errors into the DRAMs 18, or in a given one DRAM 18. As an example, each of the error words 62 can correspond to a respective one of the error injection memory location address(es) 58, such that the error injection memory location address(es) 58 can be associated with a respective one of the error words 62 on a one-for-one basis, or any other combination therein.

The control structure 52 also includes a random error generator 66 that is configured to generate random memory errors to be injected into the DRAMs 18. In the example of FIG. 2, the random error generator 66 includes an error bit quantity field 68 that is a programmable field into which a desired number of bit-errors can be specified for the resultant random memory errors that are generated by the random error generator 66. For example, the error bit quantity field 68 can correspond to how many error bits are to be included in the randomly generated memory error(s), such that the random error generator 66 can randomly select the bit-locations in an error word to randomly generate the memory error. The randomly generated memory errors can thus be injected into the error injection memory location address(es) 58 instead of or in addition to the error words 62 defined in the error definitions 60.

Additionally, the control structure 52 includes an error pattern injection system 70 that is configured to define parameters associated with an error pattern to be injected into one or more of the DRAMs 18. In the example of FIG. 2, the error pattern injection system 70 includes programmable parameters that can define the error pattern to be injected into the DRAM(s) 18. A first error parameter corresponds to a quantity of errors 72, expressed as a programmable integer "N", that defines the number of errors are to be injected into a given memory array of a respective one or more of the DRAMs 18. Thus, the quantity of errors 72 can correspond to a number of times that one or more of the memory errors defined in the error definitions 60 or generated by the random error generator 66 is injected into respective memory addresses of the DRAM(s) 18. A second error parameter corresponds to an array stride value 74, expressed as a programmable integer "M", that defines an address spacing corresponding to a separation between the consecutive memory addresses into which the memory error(s) are to be injected. Therefore, the quantity of errors 72 defines the number of memory errors to be injected at a memory address spacing that is defined by the array stride value 74.

Figure 3:
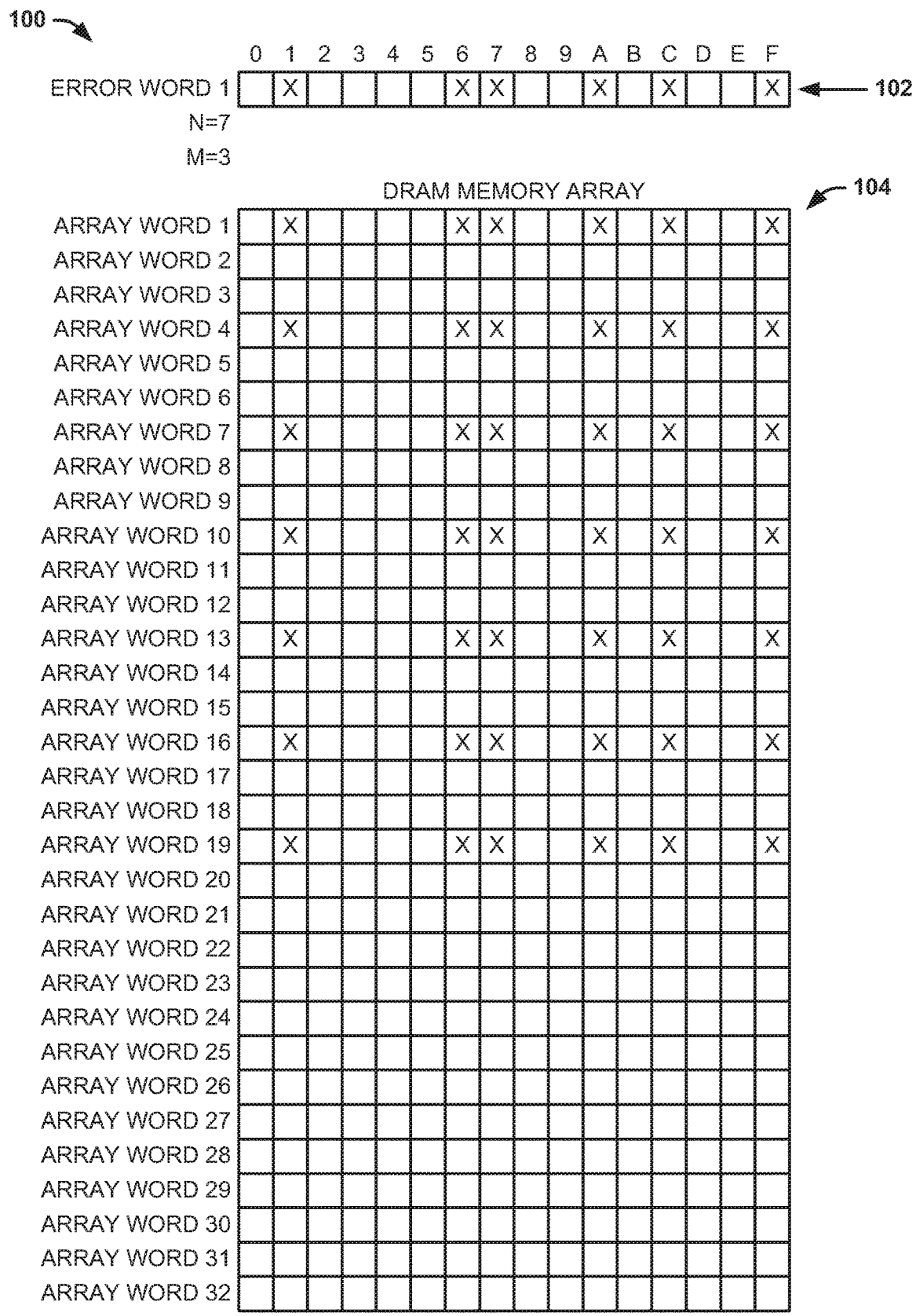
FIG. 3 illustrates an example diagram of error injection.

FIG. 3 illustrates an example diagram 100 of error injection. The diagram 100 can correspond to injecting an error pattern into a DRAM 18, as described previously. In the example of FIG. 3, the diagram 100 demonstrates an error word 102 (ERROR WORD 1) and a memory array 104 that includes a set of thirty-two memory words (ARRAY WORD 1-32) of the memory array 104 that can correspond to memory locations at thirty-two consecutive memory addresses. It is to be understood that the error word 102 and the memory words of the memory array 104 are demonstrated in the example of FIG. 3 as having sixteen-bits, and the memory array 104 includes only thirty-two memory words for simplicity. Thus, it is to be understood that the error word 102 and the memory words of the memory array 104 can include a much larger number of bits (e.g., 128-bits) and the memory array 104 can include a significantly larger number of memory words.

The error word 102 is demonstrated as having a predetermined number and location of error bits, demonstrated as "X" at each of different bit-locations in the error word 102. In the example of FIG. 3, the error word 102 includes an error bit at the first bit, the sixth bit, the seventh bit, the Ath bit, the Cth bit, and the Fth bit. As an example, the error word 102 can correspond to an error word 62 in the error definitions 60 of the control structure 52, or can correspond to a randomly generated error word via the random error generator 66 having been programmed with six bits in the error bit quantity field 68. Additionally, the diagram 100 demonstrates a quantity of errors (e.g., the quantity of errors 72) of seven based on "N=7", and demonstrates an array stride value (e.g., the array stride value 74) of three based on "M=3". Therefore, the error pattern injection system 70 can be programmed to define that seven memory errors corresponding to the error word 102 be injected in the memory array 104 at a memory address spacing of every three memory addresses of the memory array 104. In addition, the error injection memory location address(es) 58 of the control structure 54 can define that the memory address corresponding to ARRAY WORD 1 is a first memory address of the error pattern injected in the example of FIG. 3.

Therefore, the memory array 104 is demonstrated in the example of FIG. 3 as including the error pattern of the seven memory errors corresponding to the error word 102 having been injected in the memory array 104 at a memory address spacing of every three memory addresses of the memory array 104. Thus, starting at the memory address of ARRAY WORD 1, the error word 102 is injected for a first time into ARRAY WORD 1. As an example, the error bits of the error word 102 can each overwrite a bit stored in the corresponding bit location of the respective memory word of the memory array 104, with the data-bits in the other bit-locations of the memory word being unaffected by the injection of the memory error corresponding to the error word 102.

The error word 102 is also injected into ARRAY WORD 4, which is three memory address subsequent to the memory address of ARRAY WORD 1, as dictated by the array stride value M=3. The error word 102 is also injected into ARRAY WORD 7, which is three memory address subsequent to the memory address of ARRAY WORD 4, into ARRAY WORD 10, which is three memory address subsequent to the memory address of ARRAY WORD 7, into ARRAY WORD 13, which is three memory address subsequent to the memory address of ARRAY WORD 10, into ARRAY WORD 16, which is three memory address subsequent to the memory address of ARRAY WORD 13, and into ARRAY WORD 19, which is three memory address subsequent to the memory address of ARRAY WORD 16. The seventh injection of the error word 102 into ARRAY WORD 19 thus constitutes the last injection of the error word 102 into the memory array 104 based on the quantity of errors value N=7. As a result, none of the memory words ARRAY WORD 20-32 (or subsequent) include the error word 102. Accordingly, the diagram 100 demonstrates one example of an error pattern defined by the quantity of errors value N=7 and the array stride value M=3.

It is to be understood that the error pattern can be formed based on any of a variety of combinations of different error pattern parameters, different memory addresses, and different separate memory errors. For example, the error pattern can include a pattern of different memory errors that are repeated based on the same or different error pattern parameters (e.g., quantity and stride values).

Figure 4:
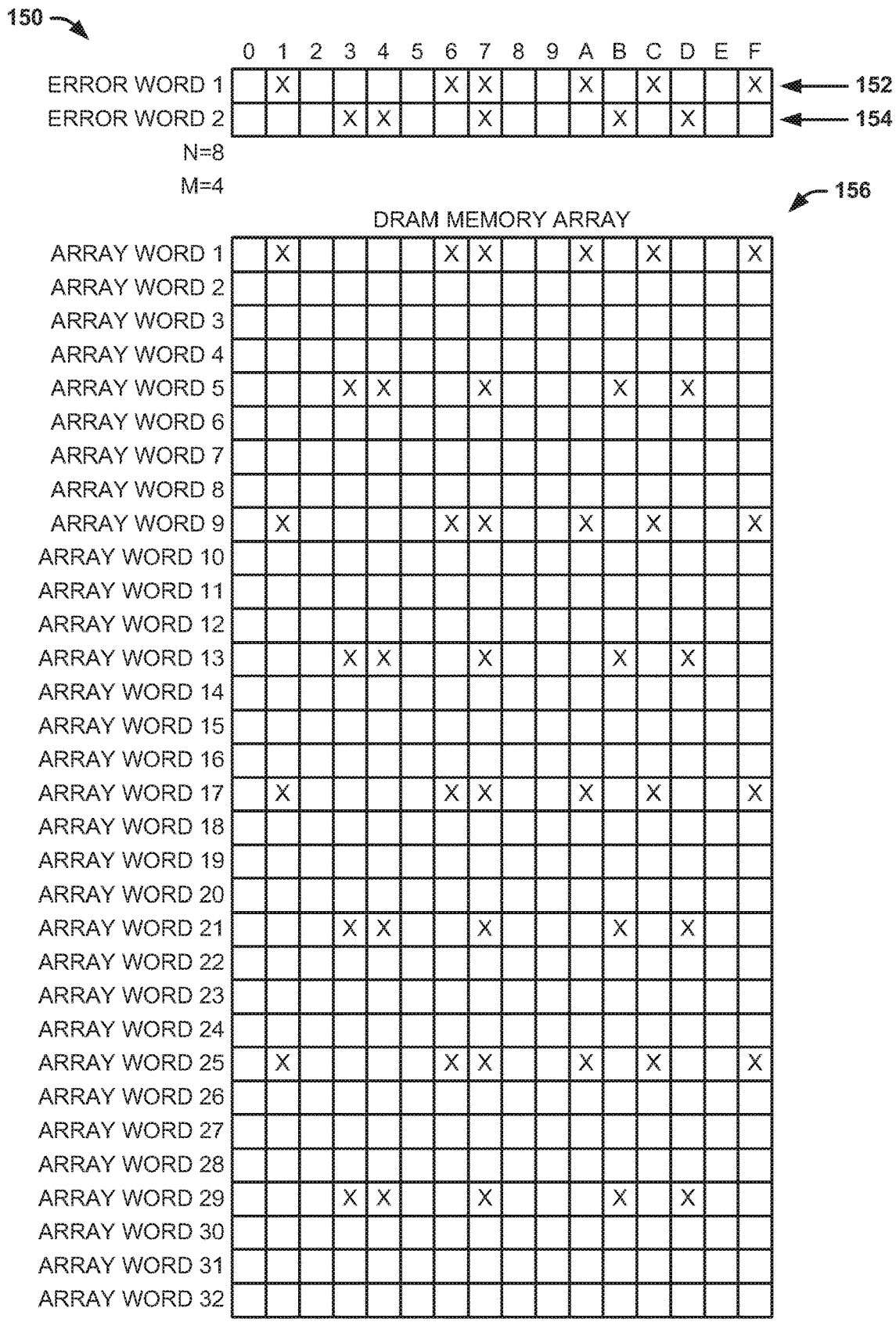
FIG. 4 illustrates another example diagram of error injection.

FIG. 4 illustrates another example diagram 150 of error injection. The diagram 150 can correspond to injecting a plurality of error patterns into a DRAM 18, as described previously. In the example of FIG. 4, the diagram 150 demonstrates a first error word 152 (ERROR WORD 1) and a second error word 154 (ERROR WORD 2). The diagram 150 also includes a memory array 156 that includes a set of thirty-two memory words (ARRAY WORD 1-32) of the memory array 156 that can correspond to memory locations at thirty-two consecutive memory addresses. It is to be understood that the first and second error words 152 and 154 and the memory words of the memory array 156 are demonstrated in the example of FIG. 4 as having sixteen-bits, and the memory array 156 includes only thirty-two memory words for simplicity. Thus, it is to be understood that the first and second error words 152 and 154 and the memory words of the memory array 156 can include a much larger number of bits (e.g., 128-bits) and the memory array 156 can include a significantly larger number of memory words.

The first and second error words 152 and 154 are each demonstrated as having a predetermined number and location of error bits, demonstrated as "X" at each of different bit-locations in the first and second error words 152 and 154. In the example of FIG. 4, the first error word 152 includes an error bit at the first bit, the sixth bit, the seventh bit, the Ath bit, the Cth bit, and the Fth bit. The second error word 154 includes an error bit at the third bit, the fourth bit, the seventh bit, the Bth bit, and the Dth bit. As an example, the first and second error words 152 and 154 can correspond to error words 62 in the error definitions 60 of the control structure 52, or can correspond to a randomly generated error words via the random error generator 66 having been programmed with six bits and five bits, respectively, in the error bit quantity field 68.

Additionally, the diagram 150 demonstrates a quantity of errors (e.g., the quantity of errors 72) of eight based on "N=8", and demonstrates an array stride value (e.g., the array stride value 74) of four based on "M=4". Therefore, the error pattern injection system 70 can be programmed to define that eight memory errors corresponding to the first error word 152 be injected in the memory array 156 at a memory address spacing of every four memory addresses of the memory array 156. In the example of FIG. 4, the error pattern parameters of N=8 and M=4 are applicable to both the first and second error words 152 and 154. However, it is to be understood that the first and second error words 152 and 154 can each have a different set of error pattern parameters (e.g., with a predetermined condition for collisions). In addition, the error injection memory location address(es) 58 of the control structure 54 can define that the memory address corresponding to ARRAY WORD 1 is a first memory address of the error pattern injected in the example of FIG. 4.

Therefore, the memory array 156 is demonstrated in the example of FIG. 4 as including the error pattern of the eight memory errors corresponding to the first and second error words 152 and 154 having been alternately injected in the memory array 156 at a memory address spacing of every four memory addresses of the memory array 156. Thus, starting at the memory address of ARRAY WORD 1, the first error word 152 is injected for a first time into ARRAY WORD 1. Similarly, the second error word 154 is injected into ARRAY WORD 5, which is four memory address subsequent to the memory address of ARRAY WORD 1, as dictated by the array stride value M=4. As an example, the error bits of the first and second error words 152 and 154 can each overwrite a bit stored in the corresponding bit location of the respective memory word of the memory array 156, with the data-bits in the other bit-locations of the memory word being unaffected by the injection of the memory error corresponding to the first and second error words 152 and 154.

Thus, the first and second error words 152 and 154 are alternately injected in the next memory words corresponding to the memory addresses defined by the stride of the array strive value of M=4. In the example of FIG. 4, the first error word 152 is also injected into ARRAY WORD 9, which is four memory address subsequent to the memory address of ARRAY WORD 5, and the second error word 154 is injected into ARRAY WORD 13, which is four memory address subsequent to the memory address of ARRAY WORD 9. Similarly, the first error word 152 is also injected into ARRAY WORD 17, which is four memory address subsequent to the memory address of ARRAY WORD 13, and the second error word 154 is injected into ARRAY WORD 21, which is four memory address subsequent to the memory address of ARRAY WORD 17. Similarly, the first error word 152 is also injected into ARRAY WORD 25, which is four memory address subsequent to the memory address of ARRAY WORD 21, and the second error word 154 is injected into ARRAY WORD 29, which is four memory address subsequent to the memory address of ARRAY WORD 25. The injection of the second error word 154 into ARRAY WORD 29 thus constitutes the last injection of the first and second error words 152 and 154 into the memory array 156 based on the quantity of errors value N=8. As a result, none of the memory words ARRAY WORD 30-32 (or subsequent) include the first and second error words 152 and 154. Accordingly, the diagram 150 demonstrates one example of an error pattern defined by the quantity of errors value N=8 and the array stride value M=4. However, as described previously, any of a variety of combinations of memory addresses, memory errors, and error pattern parameters can be implemented to provide DRAM-level error injection and correction.

Referring back to the examples of FIGS. 1 and 2, the memory address interface 54 can thus implement error injection of the memory errors that are defined by the control structure 52, such as by accessing the control structure 52 from the associated memory. As a result, the control structure 52 can provide any of a variety of different ways of providing DRAM-level error injection of memory errors into the DRAMs 18. In response to injecting the memory errors, the ECC memory 20 can provide error-correction to the DRAMs 18, and the error detector 28 can read the memory from the DRAMs 18 to determine if the ECC memory 20 was successful in providing the error-correction. As an example, the error detector 28 can compare the data stored in the DRAMs 18 with the stored memory errors saved in the error tracking data 56. Thus, the error tracking data 56 can be accessed by the error detector 28 to compare the data stored in the predetermined memory addresses of the memory storage elements to which the memory errors were written with the memory errors that were injected into the DRAMs 18 to determine if the ECC memory 20 corrected the respective memory errors. As a result, the error injection system 14 can provide error injection and error-correction validation at design and/or manufacture of the associated memory system 12.

Figure 5:
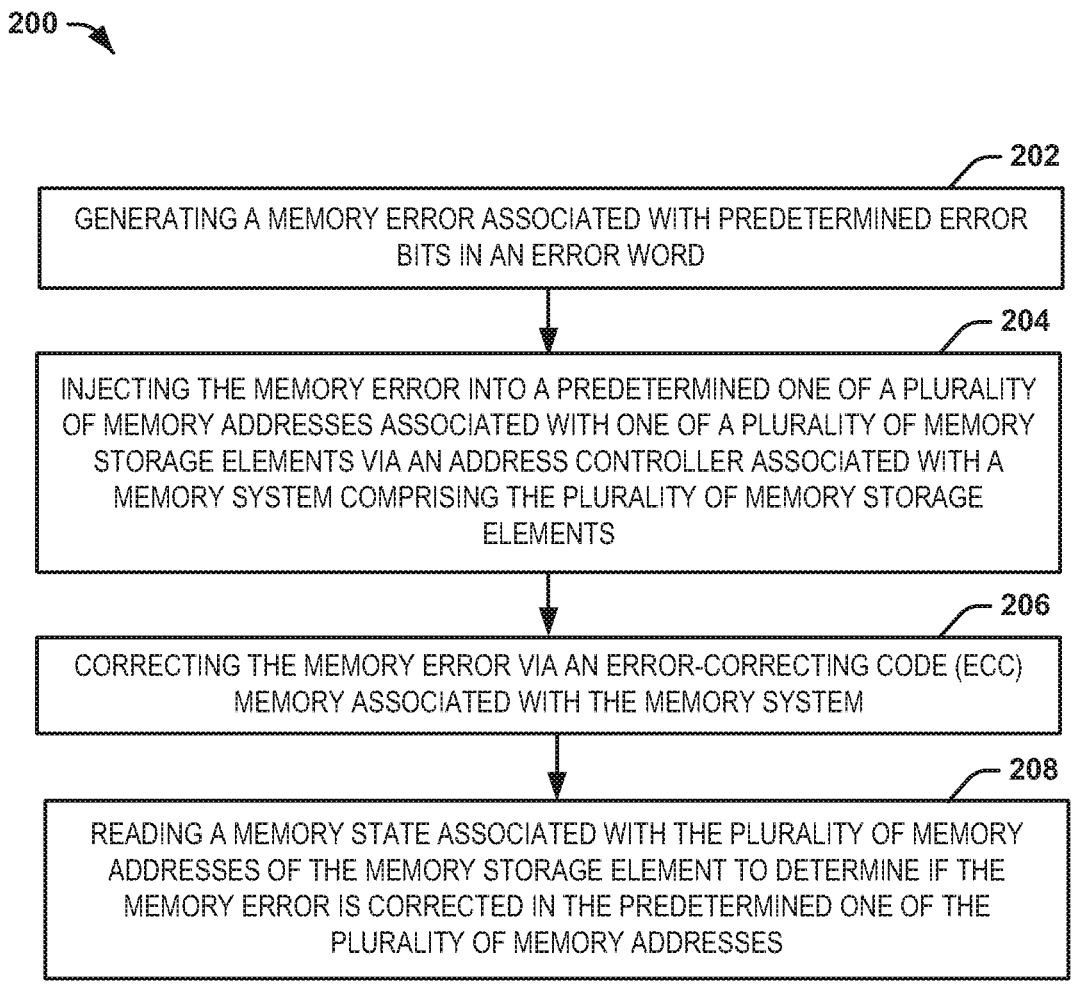
FIG. 5 illustrates an example of a method for testing a memory storage element.

In view of the foregoing structural and functional features described above, an example methodology will be better appreciated with reference to FIG. 5. While, for purposes of simplicity of explanation, the methodology of FIG. 5 is shown and described as executing serially, it is to be understood and appreciated that the present disclosure is not limited by the illustrated order, as some embodiments could in other embodiments occur in different orders and/or concurrently from that shown and described herein.

FIG. 5 illustrates an example embodiment of a method 200 for testing a memory storage element (e.g., the DRAM(s) 18). At 202, a memory error associated with predetermined error bits in an error word (e.g., the error word 102) is generated. At 204, the memory error is injected into a predetermined one of a plurality of memory addresses (e.g., in the memory array 104) associated with one of a plurality of memory storage elements via an address controller (e.g., the address controller 16) associated with a memory system (e.g., the memory system 12) comprising the plurality of memory storage elements. At 206, the memory error is corrected via an ECC memory (e.g., the ECC memory 20) associated with the memory system. At 208, a memory state associated with the plurality of memory addresses of the memory storage element is read (e.g., via the error detector 28) to determine if the memory error is corrected in the predetermined one of the plurality of memory addresses.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A system comprising an error injection system, the error injection system comprising an error injector that comprises a control structure to define a memory error, the error injector to:
   inject the memory error, in a predetermined error pattern, into a memory system at a plurality of predetermined memory addresses, each predetermined memory address associated to a memory storage element of a plurality of memory storage elements in the memory system, wherein the predetermined error pattern is defined based on a programmable error parameter that defines a number of memory errors in the memory system; and
   determine if the memory error at each predetermined memory address associated with the respective memory storage element is corrected by an error-correcting code (ECC) memory associated with the memory system.

2. The system of claim 1, wherein the programmable error parameter comprises a quantity of memory addresses at which the memory error is to be injected by the error injection system, an array stride value defining an address spacing corresponding to a separation between the consecutive memory addresses at which the memory error is to be injected by the error injection system or a combination thereof.

3. The system of claim 2, wherein the control structure comprises a predetermined error injection memory location address corresponding to a starting address in the plurality of predetermined memory addresses in the memory system, and the predetermined error pattern is defined such that the memory error is injected at the predetermined error injection memory location address and is repeated a number of times based on the quantity of memory addresses separated by the array stride value.

4. The system of claim 2, wherein the memory error comprises a plurality of programmable memory errors, wherein the predetermined error pattern comprises the plurality of programmable memory errors being distributed in the respective one of the plurality of memory storage elements in a repeated manner.

5. The system of claim 2, wherein the error pattern injection system comprises a random error generator to randomly generate the memory error based on a programmable parameter associated with the memory error.

6. The system of claim 1, wherein the control structure defines the predetermined error pattern that defines each predetermined memory address at which the memory error is injected.

7. The system of claim 1, wherein the memory system is arranged as a dual-inline memory storage module (DIMM) comprising the plurality of memory storage elements being arranged as dynamic random access memory (DRAM) modules.

8. The system of claim 1, wherein the control structure comprises a programmable data structure.

9. The system of claim 1, wherein the predetermined error pattern is defined by a quantity of memory addresses at which the memory error is to be injected by the error injection system and by an array stride value defining an address spacing corresponding to a separation between the consecutive memory addresses at which the memory error is to be injected by the error injection system.

10. A method comprising:
   generating a memory error associated with comprising predetermined error bits in an error word;
      injecting the memory error, in a predetermined error pattern, into a memory system at a plurality of predetermined memory addresses, each predetermined memory address associated to a memory storage element of a plurality of memory storage elements in the memory system, wherein the predetermined error pattern is defined based on a programmable error parameter that defines a number of memory errors in the memory system;
   correcting the memory error at each predetermined memory address associated with the respective memory storage element by an error-correcting code (ECC) memory associated with the memory system; and
   reading a content at each predetermined memory address associated with the respective memory storage element to determine if the memory error is corrected in the predetermined one of the plurality of memory addresses.

11. The method of claim 10, wherein generating the memory error comprises distributing a number of error bits in predetermined bit locations in the error word.

12. The method of claim 10, wherein injecting the memory error, in the predetermined error pattern, comprises:
   selecting a predetermined error injection memory location address corresponding to a starting address in the plurality of predetermined memory addresses in the memory system; and
   repeatedly injecting the memory error, a predetermined number of times, at each of the plurality of memory addresses starting with the predetermined error injection memory location address and incrementing subsequent memory addresses based on an array stride value.

13. The method of claim 10, wherein the memory system is arranged as a dual-inline memory storage module (DIMM) comprising the plurality of memory storage elements being arranged as dynamic random access memory (DRAM) modules.

14. The method of claim 10, wherein reading the content comprises comparing the content at each predetermined memory address with the error word to determine if the memory error is corrected at each predetermined memory address.

15. A system comprising:
   a dual-inline memory storage module (DIMM) system comprising an address controller, error-correcting code (ECC) memory, and a plurality of dynamic random access memory (DRAM) modules; and
   an error injection system comprising an error injector that comprises a programmable control structure to define a memory error, the error injector being further to:
   inject the memory error in a predetermined error pattern, into the DIMM system at a plurality of predetermined memory addresses, each predetermined memory address associated to a DRAM module of a plurality of DRAM modules in the DIMM system wherein the predetermined error pattern is defined based on a programmable error parameter that defines a number of errors in the memory system; and
   determine if the memory error at each predetermined memory address associated with the respective DRAM module is corrected by the ECC memory based on reading a content at each predetermined memory address.

16. The system of claim 15, wherein the programmable error parameter comprises a quantity of memory addresses at which the memory error is to be injected by the error injection system, an array stride value defining an address spacing corresponding to a separation between the consecutive memory addresses at which the memory error is to be injected by the error injection system or a combination thereof.

* * * * *